United States Patent
Seo et al.

(10) Patent No.: US 8,716,605 B2
(45) Date of Patent: May 6, 2014

(54) STRUCTURE FOR SHORTING LINE CONNECTING SIGNAL LINES OF FLAT PANEL DISPLAY DEVICE

(75) Inventors: Wanjin Seo, Gumi-si (KR); Euihyun Chung, Gumi-si (KR); Jiwon Kang, Gyeongbuk (KR)

(73) Assignee: LG Display Co., Ltd., Seoul (KR)

( * ) Notice: Subject to any disclaimer, the term of this patent is extended or adjusted under 35 U.S.C. 154(b) by 171 days.

(21) Appl. No.: 13/278,459

(22) Filed: Oct. 21, 2011

(65) Prior Publication Data
US 2012/0097426 A1 Apr. 26, 2012

(30) Foreign Application Priority Data

Oct. 22, 2010 (KR) .......................... 10-2010-0103537
Oct. 6, 2011 (KR) .......................... 10-2011-0102076

(51) Int. Cl.
*H05K 1/03* (2006.01)
(52) U.S. Cl.
USPC .......................................... 174/255; 174/261
(58) Field of Classification Search
None
See application file for complete search history.

(56) References Cited

U.S. PATENT DOCUMENTS

| 6,734,925 | B1 * | 5/2004 | Lee et al. | 349/40 |
| 7,443,010 | B2 * | 10/2008 | Tsao et al. | 257/620 |
| 7,608,788 | B2 * | 10/2009 | Johnson | 174/261 |
| 2004/0113149 | A1 * | 6/2004 | Kim | 257/59 |
| 2005/0056833 | A1 * | 3/2005 | Kim | 257/48 |

* cited by examiner

*Primary Examiner* — Ishwarbhai B Patel
(74) *Attorney, Agent, or Firm* — McKenna Long & Aldridge, LLP

(57) ABSTRACT

A shorting line connecting first and second signal lines arranged in parallel with each other in a flat panel display device is disclosed. The shorting line includes a first branch portion connected with the first signal line and branched from the first signal line toward the second signal line; a second branch portion connected with the second signal line and extended from the second signal line toward the first signal line; and a connection portion connecting the first branch portion to the second branch portion, wherein one end of the connection portion is connected with the first branch portion at a first angle, and another end of the connection portion is connected with the second branch portion at a second angle.

5 Claims, 3 Drawing Sheets

STRUCTURE FOR SHORTING LINE CONNECTING SIGNAL LINES OF FLAT PANEL DISPLAY DEVICE

The present application claims priority to Korean Application No. 10-2010-0103537 filed in Korea on Oct. 22, 2011, and Korean Application No. 10-2011-0102076 filed in Korea on Oct. 6, 2011 the entire contents of which are hereby incorporated by reference in their entirety.

BACKGROUND

1. Field of the Invention

The present invention relates to a structure for a shorting line interconnecting signal lines of a flat panel display device. More particularly, the present invention relates to a structure for a shorting line capable of preventing damages of signal lines when removing the shorting line temporarily interconnecting the signal lines in a later process, during a process of manufacturing the flat panel display device having signal lines such as gate lines and/or data lines.

2. Related Art

A flat panel display device such as a liquid crystal display device (LCD), a plasma display panel (PDP), a field emission display (FED), an electroluminescence display (ED), and the like includes a plurality of pixels formed by cross of a plurality of gate lines arranged in a horizontal direction and a plurality of data lines arranged in a vertical direction. During the process of manufacturing the flat panel display device, after forming the signal lines such as the gate lines (or data lines) in a condition in which the signal lines are connected to each other and completing the flat panel display device, the signal lines are separated from each other by disconnecting the connection state. As such, the connection line for temporarily interconnecting the signal lines is referred to as shorting line.

The shorting line is a line interconnecting gate lines and/or data lines in order to prevent a disconnection due to an accumulation of static electricity into gate lines and/or data lines by a subsequent process after forming the gate lines and/or the data lines. Alternatively, after completing the flat panel display device, electrical connection performance and condition for lines may be checked by using the shorting line interconnecting the gate lines (or data lines). However, in order to finally obtain a structure in which the gate lines and/or data lines are disconnected from each other, the shorting line is removed in a last process.

As to the removal of the shorting line, various methods have been proposed, and actually, the various methods have been adopted during the process of manufacturing the flat panel display device. As an example, there is a method of removing the shorting line while cutting an edge of the substrate, after forming the shorting line interconnecting gate lines (or data lines) in an extension area from the outside of a gate pad (or data pad) formed on one end of the gate line (or data line). As another example, there is a method of removing the shorting line by an etching process after forming the shorting line interconnecting the gate lines (or data lines) in an inner area of the gate pad (or data pad).

More specifically, during a manufacturing process, the method of removing the shorting line by the etching process is used, wherein an etching solution is permeated into the signal line connected to the shorting line as well as the shorting line, such that the signal lines may be opened. In addition, as resolution of a display device is increased, the number of signal lines is increased and distance between the signal lines is narrower. In this case, a length of the shorting line connecting the adjacent signal lines is also shorter. Thus, it is highly possible to disconnect the signal line since the etching solution may be permeated into the signal line when the shorting line is removed by the etching process. Therefore, in this case, there is a need to provide a structure capable of removing only the shorting line without affecting the signal lines of the flat panel display device.

SUMMARY

The present invention has been made to solve the problem described above. More specifically, the present invention has been made in an effort to provide a flat panel display device having a structure for a shorting line capable of preventing an open or a damage of a signal line due to an etching solution for removing the shorting line, during a process of removing the shorting line temporarily interconnected to the signal line.

Additional features and advantages of this invention will be set forth in the description which follows, and in part will be apparent from the description, or may be learned by practice of this invention. The objectives and other advantages of this invention will be realized and attained by the structure particularly pointed out in the written description and claims hereof as well as the appended drawings.

To achieve these and other advantages and in accordance with the purpose of this invention, as embodied and broadly described, a shorting line connecting signal lines arranged in parallel with each other in a flat panel display device includes a first branch portion connected with the first signal line and branched from the first signal line toward the second signal line; a second branch portion connected with the second signal line and extended from the second signal line toward the first signal line; and a connection portion connecting the first branch portion to the second branch portion, wherein one end of the connection portion is connected with the first branch portion at a first angle, and another end of the connection portion is connected with the second branch portion at a second angle.

The shorting line further includes a first bank extended from the first branch portion to the first signal line between the first branch portion and the first signal line so that a width of the first bank is wider than that of the first branch portion; and a second bank extended from the second branch portion to the second signal line between the second branch portion and the second signal line so that a width of the second bank is wider than that of the second branch portion Each of the first and second angles has a range of 20°~90°.
The connection portion has at least one bending portion, and the bending portion is bended at an angle of 20°~90.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings.

Figure 1:
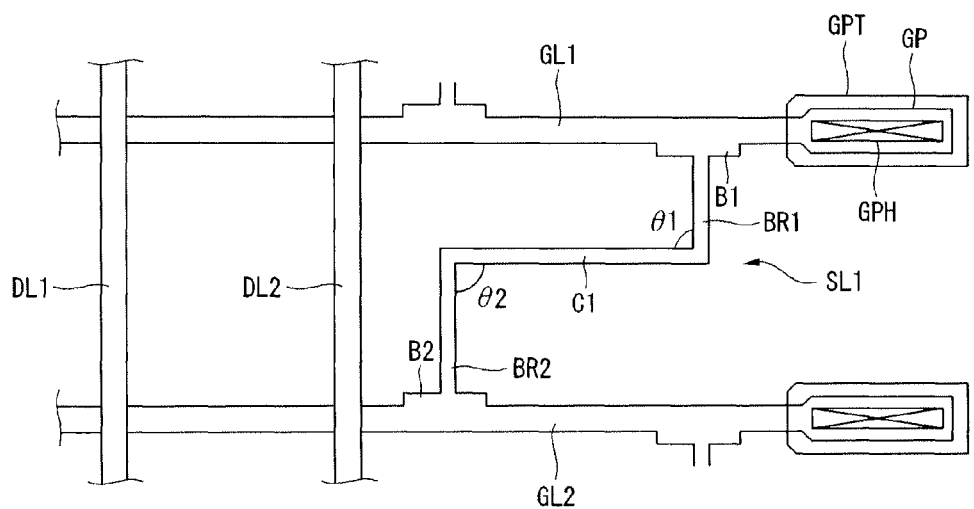
FIG. 1 is an enlarged plan view illustrating a structure of a shorting line interconnecting signal lines of a flat panel display device in accordance with a first embodiment of the present invention.

FIG. 1 is an enlarged plan view illustrating a structure of a shorting line interconnecting signal lines of a flat panel display device in accordance with a first embodiment of the present invention. Referring to FIG. 1, the flat panel display device includes a plurality of gate lines GL1 and GL2 arranged in parallel with a first direction (e.g. a horizontal direction) and a plurality of data lines DL1 and DL2 arranged in parallel with a second direction (e.g. a vertical direction) crossing over the first direction. Although not illustrated in the drawings, a plurality of pixels are formed by cross of the gate lines GL1 and GL2 and the data lines DL1 and DL2. Each of the gate lines GL1 and GL2 has one end which is connected with a gate pad GP. In addition, each of the data lines DL1 and DL2 has one end which is connected with a data pad (not shown).

The gate pad GP is a connection portion between the gate line and a gate driver in order to transmit scanning signals from the gate driver to the gate lines GL1 and GL2. Therefore, on the gate pad GP, a gate pad terminal GPT for a connection is formed. The gate pad GP is structurally formed on the lowermost layer and may be covered with a gate insulating film and/or a protecting film, and the like. A gate pad contact hole GPH is formed by the removal of a portion of the gate insulating film and/or the protecting film covering the gate pad GP. In this case, the gate pad terminal GPT may be in contact with the gate pad GP through a gate pad contact hole GPH.

In the flat panel display device having the same structure as described above, the gate lines GL1 and GL2 may be temporarily connected to each other by the shorting line SL1. In the first embodiment, the shorting line SL1 has a first branch portion BR1 branched from a first gate line GL1 toward a second gate line GL2 arranged in parallel with the first gate line GL1 as shown in FIG. 1. In addition, the shorting line SL1 has a second branch portion BR2 branched from the second gate line GL2 toward the first gate line GL1. The shorting line SL1 has a connection portion C1 which connects the first branch portion BR1 with the second branch portion BR2.

The first branch portion BR1 meets one end of the connection portion C1 at a first angle θ1. In addition, the second branch portion BR2 meets another end of the connection portion C1 at a second angle θ2. Accordingly, the first gate line GL1 and the second gate line GL2 have a connected structure by the shorting line SL. Herein, each of the first angle and second angle has a range from 20° to 90°.

In addition, the shorting line SL1 includes a first bank B1 having a width wider than that of the branch portion BR1 of the shorting line SL1 at a position where the first branch portion BR1 is connected to the first gate line GL1. The first bank B1 serves to inhibit the etching solution from permeating into the first gate line GL1 along the first branch portion BR1 during the process of removing the shorting line SL1. Similarly, the shorting line SL1 includes a second bank B2 having a width wider than that of the shorting line SL1 at a position where the second branch portion BR2 is connected to the second gate line GL2. The second bank B2 serves to inhibit the etching solution from permeating into the second gate line GL2 along the second branch portion BR2 during the process of removing the shorting line SL1.

Figure 2:
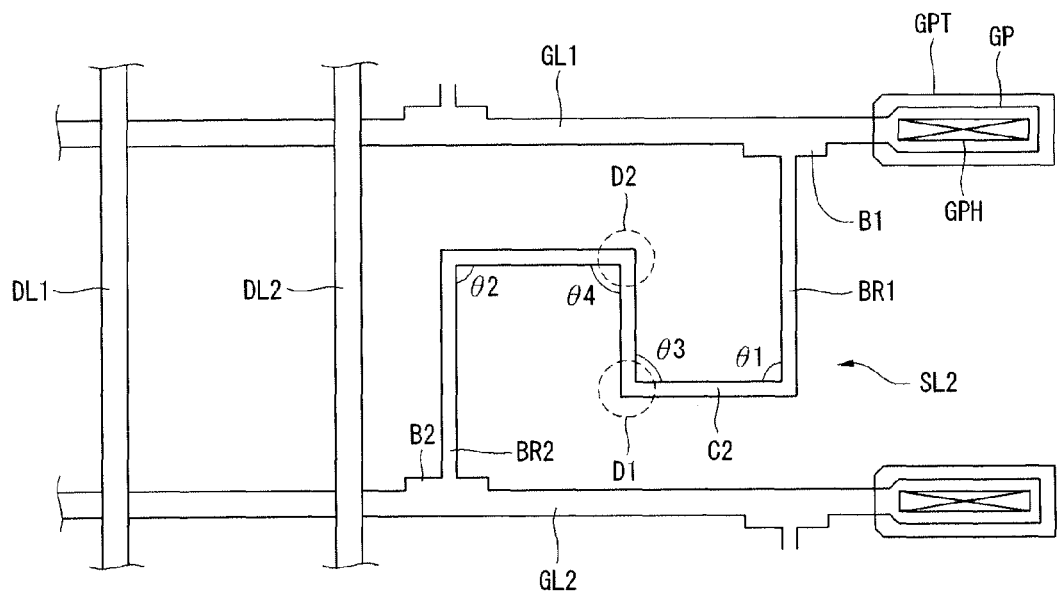
FIG. 2 is an enlarged plan view illustrating a structure of a shorting line interconnecting signal lines of a flat panel display device in accordance with a second embodiment of the present invention.

FIG. 2 is an enlarged plan view illustrating a structure of a shorting line interconnecting signal lines of a flat panel display device in accordance with a second embodiment of the present invention.

Referring to FIG. 2, the flat panel display device includes a plurality of gate lines GL1 and GL2 arranged in parallel with a first direction (e.g. a horizontal direction) and a plurality of data lines DL1 and DL2 arranged in parallel with a second direction (e.g. a vertical direction) crossing over the first direction. Although not illustrated in the drawings, a plurality of pixels are formed by cross of the gate lines GL1 and GL2 and the data lines DL1 and DL2. Each of the gate lines GL1 and GL2 has one end which is connected with a gate pad GP. In addition, each of the data lines DL1 and DL2 has one end which is connected with a data pad (not shown).

The gate pad GP is a connection portion between the gate line and a gate driver in order to transmit scanning signals from the gate driver to the gate lines GL1 and GL2. Therefore, on the gate pad GP, a gate pad terminal GPT for a connection is formed. The gate pad GP is structurally formed on the lowermost layer and may be covered with a gate insulating film and/or a protecting film, and the like. A gate pad contact hole GPH is formed by the removal of a portion of the gate insulating film and/or the protecting film covering the gate pad GP. In this case, the gate pad terminal GPT may be in contact with the gate pad GP through a gate pad contact hole GPH.

In the flat panel display device having the same structure as described above, the gate lines GL1 and GL2 may be temporarily connected to each other by the shorting line SL2. In the second embodiment, the shorting line SL2 has a first branch portion BR1 branched from a first gate line GL1 toward a second gate line GL2 arranged in parallel with the first gate line GL1 as shown in FIG. 2. In addition, the shorting line SL2 has a second branch portion BR2 branched from the second gate line GL2 toward the first gate line GL1. The shorting line SL2 has a connection portion C2 which connects the first branch portion BR1 with the second branch portion BR2.

The first branch portion BR1 meets one end of the connection portion C2 at a first angle θ1. In addition, the second branch portion BR2 meets another end of the connection portion C2 at a second angle θ2. Accordingly, the first gate line GL1 and the second gate line GL2 have a connected structure by the shorting line SL2. Herein, each of the first angle and second angle has a range from 20° to 90°.

In addition, the shorting line SL2 includes a first bank B1 having a width wider than that of the first branch portion BR1 of the shorting line SL2 at a position where the first branch portion BR1 is connected to the first gate line GL1. The first bank B1 serves to inhibit the etching solution from permeating into the first gate line GL1 along the first branch portion BR1 during the process of removing the shorting line SL. Similarly, the shorting line SL2 includes a second bank B2 having a width wider than that of the shorting line SL2 at a position where the second branch portion BR2 is connected to the second gate line GL2. The second bank B2 serves to inhibit the etching solution from permeating into the second gate line GL2 along the second branch portion BR2 during the process of removing the shorting line SL2.

The connection portion C2 of the shorting line SL2 may have one and more bending portions. In the description according to the second embodiment of this invention, the connection portion C2 having two bending portions D1 and D2 is described as one example. The first bending portion D12 is formed at a third angle $\theta 3$ and the second bending portion D2 is formed at a fourth angle $\theta 4$. Herein, each of the third angle and fourth angle has a range from 20° to 90°.

During the process of manufacturing the flat panel display device, it is preferable that the shorting line SL1 or SL2 is removed without any additional process. Therefore, when the gate pad contact hole GPH exposing the gate pad GP is formed, a shorting line opening SLH1 or SLH2 is formed so that the connection portion C1 or C2 of the shorting line SL1 or SL2 is partially exposed through the shorting line opening SLH1 or SLH2. In addition, the part of the connection portion C1 or C2 of the shorting line SL1 or SL2 exposed by the etching solution is removed during a step of patterning the gate pad terminal GPT.

Figure 3A:
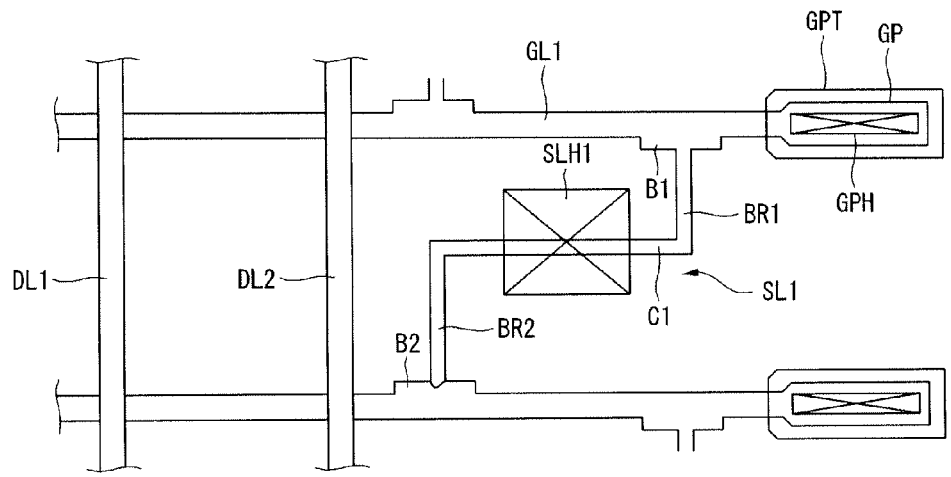
FIG. 3A is an enlarged plan view illustrating a position of contact hole for etching the shorting line shown in FIG. 1.
Figure 3B:
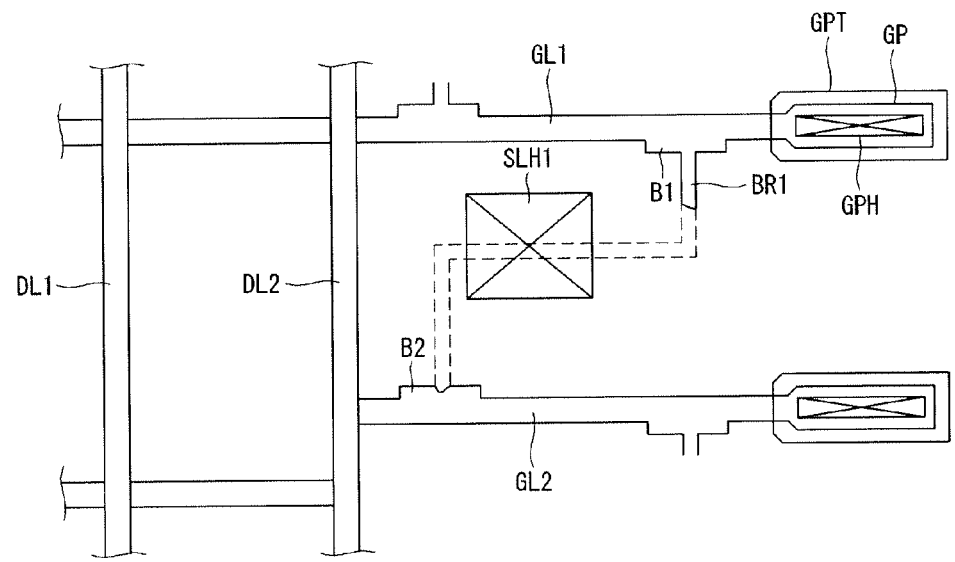
FIG. 3B is an enlarged plan view illustrating a condition in which the shorting line is removed by an etching solution during a process of removing the shorting line having the structure as illustrated in FIG. 1.
Figure 4A:
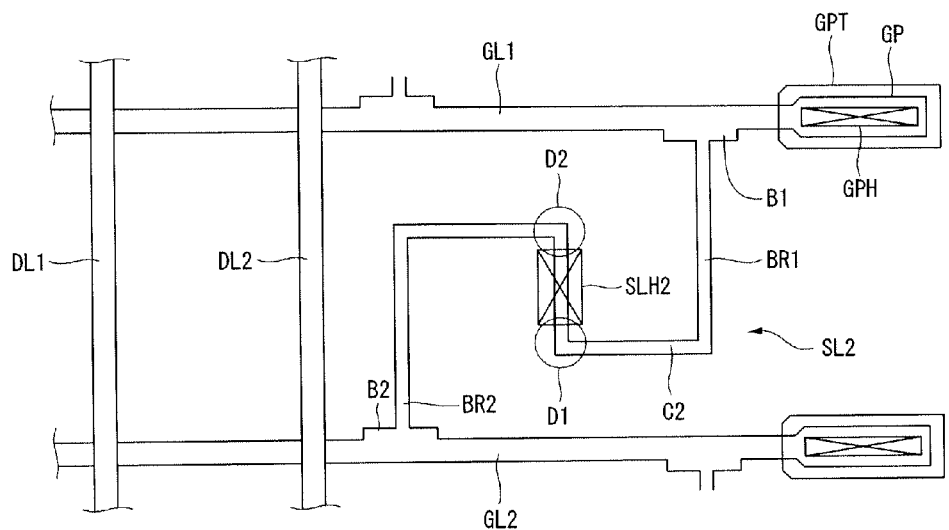
FIG. 4A is an enlarged plan view illustrating a position of contact hole for etching the shorting line shown in FIG. 1.
Figure 4B:
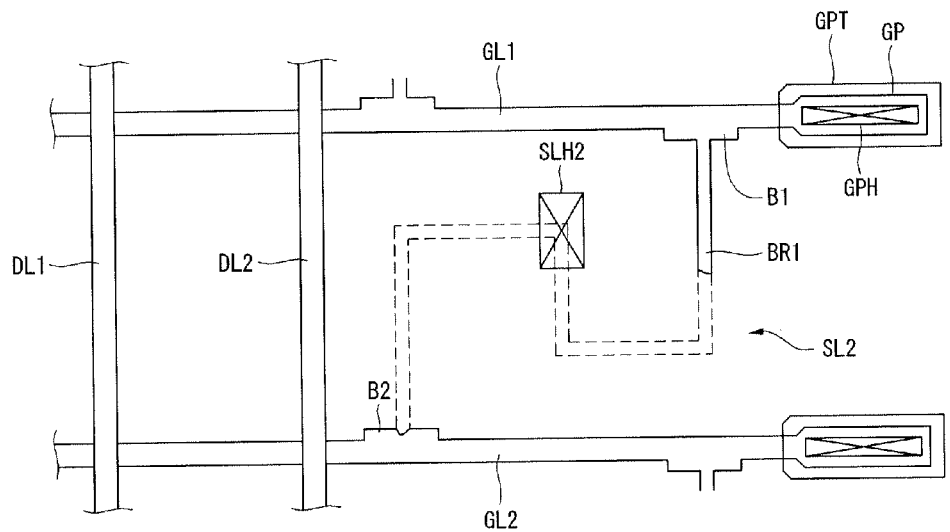
FIG. 4B is an enlarged plan view illustrating a condition in which the shorting line is removed by an etching solution during a process of removing the shorting line having the structure as illustrated FIG. 2.

FIG. 3A is an enlarged plan view illustrating a position of contact hole for etching the shorting line shown in FIG. 1, FIG. 3B is an enlarged plan view illustrating a condition in which the shorting line is removed by an etching solution during a process of removing the shorting line having the structure as illustrated in FIG. 1, FIG. 4A is an enlarged plan view illustrating a position of contact hole for etching the shorting line shown in FIG. 1. And FIG. 4B is an enlarged plan view illustrating a condition in which the shorting line is removed by an etching solution during a process of removing the shorting line having the structure as illustrated FIG. 2. FIGS. 3B and 4B are shown as examples in which the shorting line opening SLH1 or SLH2 are slightly shifted from a center position in consideration of a certain amount of error.

Referring to FIGS. 3A and 3B, during a portion of the connection portion C1 of the shorting line SL1 exposed through the shorting line opening SLH1 is removed, the etching solution may be permeated into another part of the shorting line SL1 unexposed through the shorting line opening SLH1. However, the permeation rate of the etching solution is delayed because two bending portions are formed at first and second angles $\theta 1$ and $\theta 2$ at positions where the connection portion C1 are connected with the first branch portion BR1 and the second branch portion BR2 as shown in FIG. 1. In addition, the first and second banks B1 and B2 are each formed between the first gate line GL1 and the first branch portion BR1 of the shorting line SL1, and the second gate line GL2 and the second branch portion BR2 of the shorting line SL1. Therefore, even though the etching solution is permeated into the vicinity of the first gate line GL1 and the second gate line GL2, the permeated etching solution is further inhibited by the first and second banks B1 and B2.

In FIG. 3B, the dotted line represents parts of the shorting line SL1 removed by the etching solution. The connection portion C1 is entirely removed, and the first branch portion BR1 is partially removed. However, since a permeation path of the etching solution is complex and long, a part of the first branch portion BR1 remains as it is as shown in FIG. 3B. Meanwhile, in the second gate line GL2, the second branch portion BR2 of the shorting line SL1 is entirely removed. However, the second gate line GL2 is not damaged since the permeation of the etching solution is inhibited by the second bank B2. In the shorting line SL1 interconnecting the gate lines GL1 and GL2 of the flat panel display device according to the first embodiment, the shorting line structure effectively inhibits the etching solution from permeating into the signal line before removing the shorting line.

Referring to FIGS. 4A and 4B, during a portion of the connection portion C2 of the shorting line SL2 is removed by the etching solution, the etching solution may be permeated into another part of the shorting line SL2 unexposed through the shorting line opening SLH2. However, the permeation rate of the etching solution may be delayed by bending portions are formed at first and second angles $\theta 1$ and $\theta 2$, and two further bending portions D1 and D2 further installed in the shorting line SL2 according to the second embodiment of the present invention. In addition, the first and second banks B1 and B2 are each formed in parts in which the first gate line GL1 and the second gate line GL2 meet the shorting line SL. Therefore, even though the etching solution is permeated into the vicinity of the first gate line GL1 and the second gate line GL2, the permeation of the etching solution is further inhibited by the first and second banks B1 and B2.

In FIG. 4B, the dotted line represents parts the shorting line SL removed by the etching solution. The connection portion C2 and the second branch portion BR2 are entirely removed, even though the first branch portion BR1 is partially removed. However, since a permeation path of the etching solution is complex and long, a part of the first branch portion BR1 remains as it is as shown in FIG. 4B. Meanwhile, in the second gate line GL2, the second branch portion BR2 of the shorting line SL2 is entirely removed. However, the second gate line GL2 is not damaged since the permeation of the etching solution is inhibited by the second bank B2. In the shorting line SL2 interconnecting the signal lines of the flat panel display device according to the second embodiment, although the shorting line SL2 is finally removed by etching solution, the shorting line structure effectively inhibits the etching solution permeated into the signal line before removing the shorting line.

According to the present invention, the shorting line interconnecting the signal lines of the flat panel display device includes at least two bending portions between the signal lines. Therefore, when removing the shorting line by an etching process, since a shape of the signal line is complex and long, the permeation rate of the etching solution may be delayed. In addition, it is possible to inhibit the etching solution from permeating into the signal line by the bending portion. Therefore, it is possible to prevent an open of signal lines in the flat panel display device due to the etching solution during the process of removing the shorting line.

While the present invention has been particularly shown and described with reference to exemplary embodiments thereof, it will be understood by those of ordinary skill in the art that various changes in form and details may be made therein without departing from the spirit and scope of the present invention as defined by the following claims. In the preferred embodiments of this invention, it is described that the shorting line connects a plurality of gate lines. However this invention is not limited thereto. For example, the shorting line may connect a plurality of data lines or common lines. Accordingly, it is should be understood that the signal line includes gate lines, data lines and common lines in a flat panel display device.

What is claimed is:

1. A shorting line connecting a first signal line to a second signal line, the first and second lines being adjacent and arranged in parallel with each other in a flat panel display device, and the shorting line comprising:

a first branch portion connected with the first signal line and branched from the first signal line toward the second signal line;

a second branch portion connected with the second signal line and extended from the second signal line toward the first signal line; and a connection portion connecting the first branch portion to the second branch portion, wherein one end of the connection portion is connected with the first branch portion at a first angle, and another end of the connection portion is connected with the second branch portion at a second angle.

2. The shorting line according to claim 1, further comprising:

a first bank extended from the first branch portion to the first signal line between the first branch portion and the first signal line so that a width of the first bank is wider than that of the first branch portion; and a second bank extended from the second branch portion to the second signal line between the second branch portion and the second signal line so that a width of the second bank is wider than that of the second branch portion.

3. The shorting line according to claim 1, wherein each of the first and second angles has a range of 20°~90°.

4. The shorting line according to claim 1, wherein the connection portion has at least one bending portion.

5. The shorting line according to claim 4, wherein the bending portion is bended at an angle of 20°~90.

\* \* \* \* \*